US012793771B2

(12) United States Patent
Giazotto et al.

(10) Patent No.: US 12,793,771 B2
(45) Date of Patent: Nov. 10, 2026

(54) SUPERCONDUCTING BIPOLAR THERMOELECTRIC MEMORY AND METHOD FOR WRITING A SUPERCONDUCTING BIPOLAR THERMOELECTRIC MEMORY

(71) Applicant: CONSIGLIO NAZIONALE DELLE RICERCHE, Rome (IT)

(72) Inventors: Francesco Giazotto, Rome (IT); Federico Paolucci, Rome (IT); Alessandro Braggio, Rome (IT); Giampiero Marchegiani, Rome (IT); Gaia Germanese, Rome (IT)

(73) Assignee: CONSIGLIO NAZIONALE DELLE RICHERCHE, Rome (IT)

( * ) Notice: Subject to any disclaimer, the term of this patent is extended or adjusted under 35 U.S.C. 154(b) by 169 days.

(21) Appl. No.: 18/721,641

(22) PCT Filed: Dec. 20, 2022

(86) PCT No.: PCT/IB2022/062517

§ 371 (c)(1),
(2) Date: Jun. 18, 2024

(87) PCT Pub. No.: WO2023/119142

PCT Pub. Date: Jun. 29, 2023

(65) Prior Publication Data

US 2025/0054538 A1 Feb. 13, 2025

(30) Foreign Application Priority Data

Dec. 21, 2021 (IT) ........................ 102021000032042

(51) Int. Cl.

| | |
|---|---|
| ***G11C 11/44*** | (2006.01) |
| ***H10N 10/855*** | (2023.01) |
| ***H10N 60/10*** | (2023.01) |

(52) U.S. Cl.
CPC ......... *G11C 11/44* (2013.01); *H10N 10/8552* (2023.02); *H10N 60/10* (2023.02)

(58) Field of Classification Search
CPC ..... G11C 11/44; H10N 10/8552; H10N 60/10
(Continued)

(56) References Cited

U.S. PATENT DOCUMENTS 10,401,393 B2 * 9/2019 Levin ................. G01R 19/0092
10,984,857 B2 * 4/2021 Najafi .................... H10N 60/83
(Continued)

OTHER PUBLICATIONS

G. Marchegiani et al., "Nonlinear Thermoelectricity with Electron-Hole Symmetric Systems", Physical Review Letters,vol. {0} 124: 1-19 (2020).

(Continued)

*Primary Examiner* — Huan Hoang
(74) *Attorney, Agent, or Firm* — Merchant & Gould P.C.

(57) ABSTRACT

A superconducting bipolar thermoelectric memory includes a memory cell, a connection in parallel between a bipolar thermoelectric element and a predetermined resistive load, and a writing element. A current generator is arranged to send an injected current to the thermoelectric element and the resistive load. The thermoelectric element is arranged to be heated by a predetermined thermal gradient and to generate corresponding output voltages on the resistive load depending on the sign of the injected current at the writing stage. The output voltages correspond to respective stable logic states stored by the memory resetting the bias current to zero.

8 Claims, 4 Drawing Sheets

(58) Field of Classification Search
USPC .......................................................... 365/162
See application file for complete search history.

(56) References Cited

U.S. PATENT DOCUMENTS

| | | | | |
|---|---|---|---|---|
| 11,473,974 | B2 * | 10/2022 | Thompson ............ | G01J 1/0425 |
| 2011/0139203 | A1 * | 6/2011 | Yap ........................ | H10N 10/13<br>136/205 |

OTHER PUBLICATIONS

G. Germanese et al., "Spontaneous symmetry breaking-induced thermospin effect in superconducting tunnel junctions", arxiv.org, Cornell University Library, 201 Olin Library Cornell University Ithaca, NY 14853: 1 (2021).
G. Marchegiai et al., "Noise effects in the nonlinear thermoelectricity of a Josephson junction", arxiv.org, Cornell University Library, 201 Olin Library Cornell University Ithaca, NY 14853: 1-5 (2020).
International Search Report and Written Opinion for PCT/IB2022/062517 (Feb. 22, 2023).

* cited by examiner

Fig.4
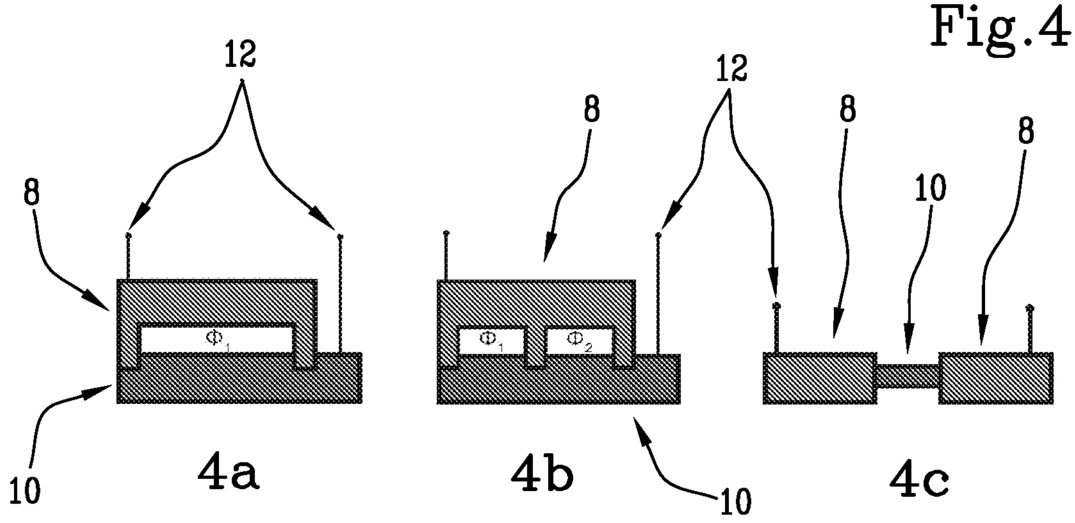
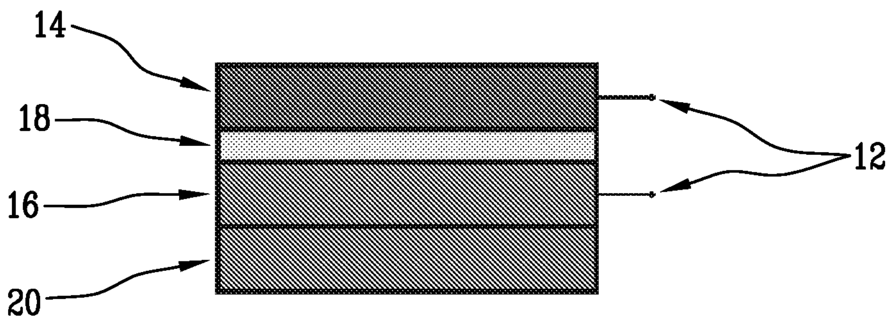
Fig.5
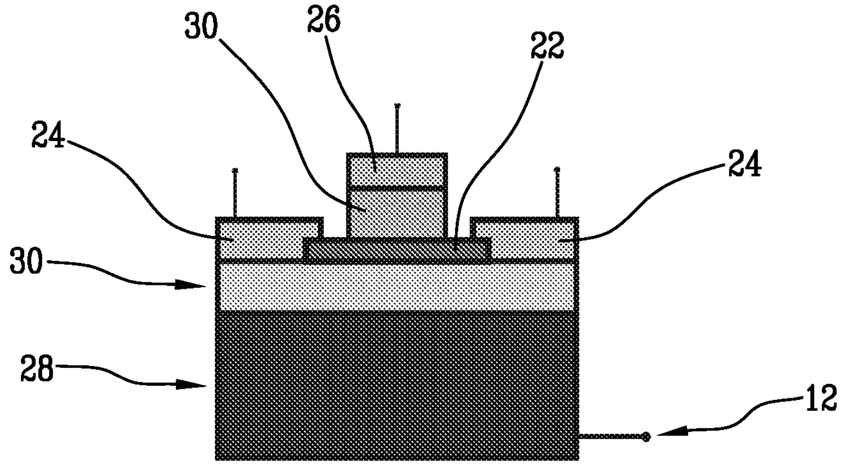
Fig.6

SUPERCONDUCTING BIPOLAR THERMOELECTRIC MEMORY AND METHOD FOR WRITING A SUPERCONDUCTING BIPOLAR THERMOELECTRIC MEMORY

This application is a National Stage Application of International Application No. PCT/IB2022/062517, filed Dec. 20, 2022, which claims benefit of application No. 102021000032042, filed Dec. 21, 2021 in Italy and which applications are incorporated herein by reference. To the extent appropriate, a claim of priority is made to each of the above-disclosed applications.

The present invention relates to a superconducting memory capable of encoding a logic state into an output electrical voltage, thanks to the presence of a finite thermal gradient representing the power supply of the memory itself (bipolar thermoelectric effect), and to a method for writing such superconducting memory.

The recent quantum technologies development has led to increasing interest in the study of thermoelectric phenomena in superconducting and hybrid devices. The main reason lies in the control of thermal phenomena, which are inevitably generated in devices used in computing environments. The innovative methodologies are focused on the management of the heat generated in this kind of devices and the miniaturization of their components; they represent the main challenge in both classical and quantum computation. Moreover, the possibility to control thermoelectric phenomena generated in superconductors becomes also an asset for the development of new high-sensitivity sensors.

One of the main challenges related to these technologies is recycling the heat produced in computing environments.

Known superconducting memories [IEEE Trans. Appl. Supercond. 2, 95-100 (1992); Phys. Procedia 36, 35-41 (2012); IEEE Trans. Appl. Supercond. 23, 1701208-1701208 (2013); Nat. Commun. 5, 3888 (2014); Nat. Commun 6, 8628 (2015); New J. Phys. 19, 063015 (2017); Supercond. Sci. Technol. 32, 015001 (2018); Appl. Phys. Lett. 118, 112603 (2021)] do not contribute to the recycling of the heat produced in computing environments, and they have limitations in response times since they are driven by magnetic field pulses.

There is therefore the need to have a superconducting memory capable of employing the heat dissipated in electrical components exploited in quantum and classical computation, with high response speed, and stable and durable performances, thus overcoming the problems of the prior art.

These and other objects are fully achieved by virtue of a superconducting bipolar thermoelectric memory, and by a method for writing a superconducting memory.

Preferred embodiments of the invention are specified in the claims, whose subject-matter is to be understood as forming integral or integrating part of the present description.

Further characteristics and advantages of the present invention will become apparent from the following description, provided merely by way of non-limiting example, with reference to the attached drawings, in which.

Figure 7:
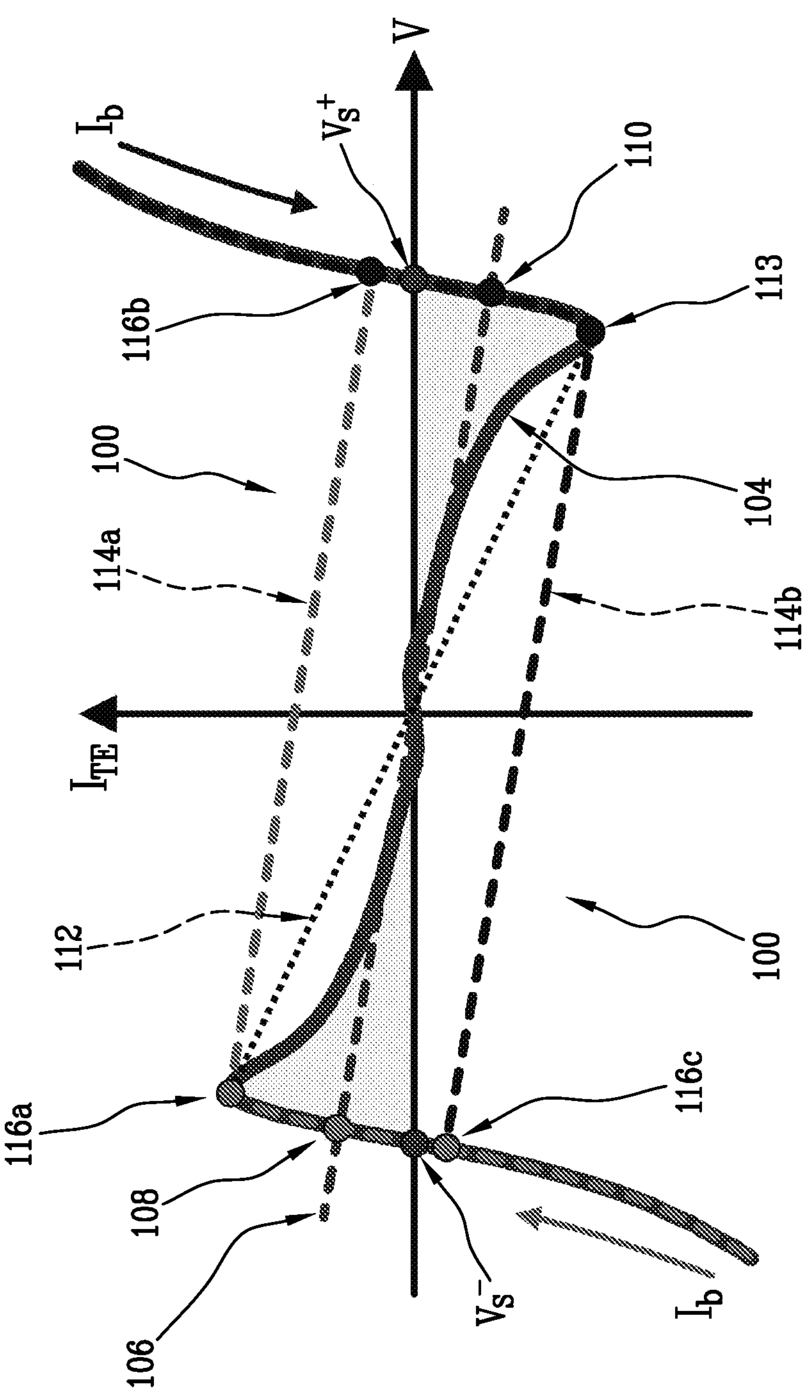
Figure 8:
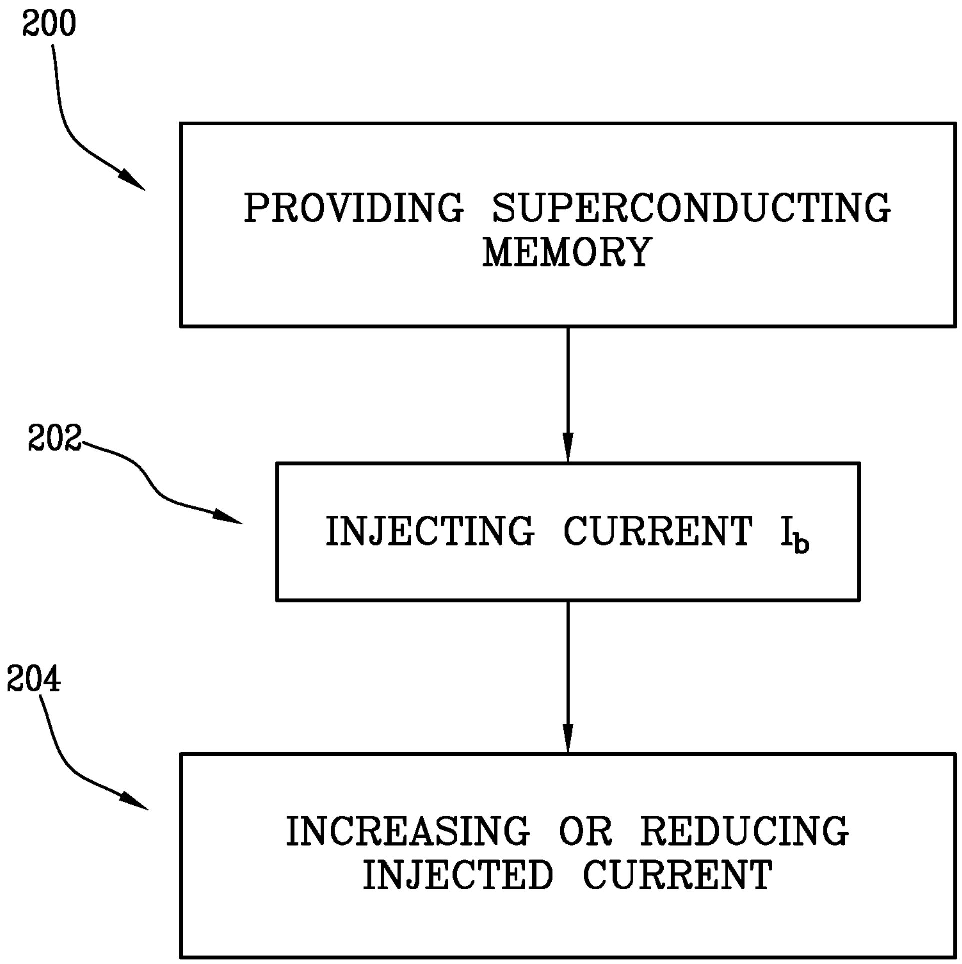

FIGS. 4*a*-4*c* show a top view of junctions forming the thermoelectric element of the superconducting memory;

FIG. 5 shows a sectional view of a Superconductor-Insulator-Superconductor-Ferromagnetic insulator junction;

FIG. 6 shows a sectional view of a Superconductor-Insulator-Semiconductor junction;

FIG. 7 shows a current-voltage characteristic of the thermoelectric element; and FIG. 8 shows a block diagram of the step of a method for writing a superconducting memory according to the present invention.

The present invention is a superconducting memory based on the bipolar thermoelectric effect. The superconducting memory encodes two (or more) logic states into an electrical output voltage in the presence of a fixed thermal gradient, which can be determined by a direct power supply or from another source of heat (heat harvesting).

The memory is volatile since, in the absence of a temperature gradient (power supply), it cannot store the output state.

The superconducting bipolar thermoelectric memory of the present invention allows reconverting the heat dissipated in logic elements of a circuit into on-chip reusable electrical DC power. In particular, the superconducting memory exploits a bipolar thermoelectric effect generated in a superconducting tunnel junction in the presence of a thermal gradient (nonlinear regime) across the junction [Phys. Rev. Lett. 124, 106801 (2020); Phys. Rev. B 101, 214509 (2020); Phys. Rev. B 104, 184502 (2021)], assuming a suppressed Josephson coupling, which would be detrimental for the operation of the memory itself.

An appropriate material and design selection, used for the realization of the superconducting memory, potentially permits extending its operating range to not only cryogenic temperatures. In this way, the superconducting memory becomes easier to apply.

Figure 1:
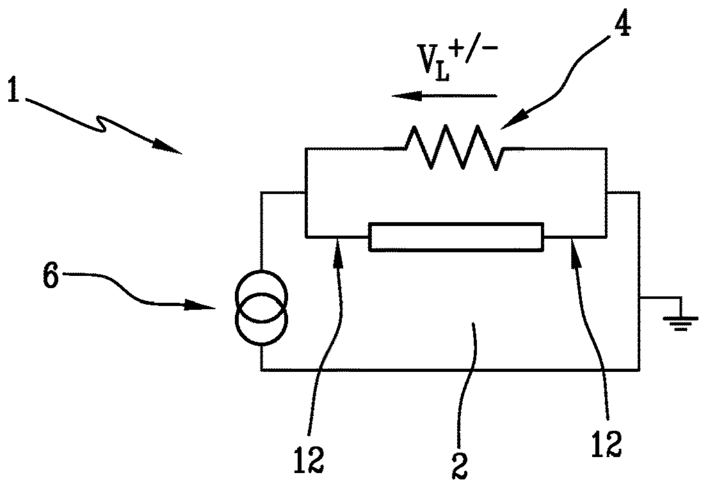
FIG. 1 shows a schematic view of the electrical circuit of a superconducting bipolar thermoelectric memory according to the present invention.

FIG. 1 shows a schematic view of the electric circuit of a superconducting bipolar thermoelectric memory 1 according to the present invention.

The superconducting memory 1 is based on a circuit comprising a connection in parallel between a bipolar thermoelectric element 2 and a predetermined resistive load 4.

The whole parallel branch of the circuit is connected to a current generator 6, which represents the writing/erasing control element of the circuit, arranged to send an injected (controlled) current $I_b$ in the parallel of the thermoelectric element 2 and the resistive load 4.

The injected current $I_b$ divides into two branches, the one of the resistive load 4 and the one of the thermoelectric element 2, depending on the resistance it encounters. When the thermoelectric element 2 behaves as a dissipative element (it does not generate thermoelectric current), the current $I_b$ passes mainly into the branch of the thermoelectric element 2 because its resistance is less than the resistance of the resistive load 4. When the thermoelectric element 2 behaves as an active element (it generates thermoelectric current $I_{TE}$ against the voltage), the injected current $I_b$ adds with $I_{TE}$ and both flows in the resistive load 4. When the injected current $I_b$ is reset to zero ($I_b$=0), only the thermoelectric current $I_{TE}$ generated by the thermoelectric element 2 circulates in the resistive load 4.

The thermoelectric element 2 is arranged to be heated with a predetermined fixed thermal gradient, to encode logic states as output voltages $V_L^+$, $V_L^-$ across the resistive load 4, which depend on the sign of the injected current $I_b$ at the writing stage. Once the parallel circuit of the thermoelectric element 2 and the resistive lead 4 reaches one of the two metastable states at the output voltages $V_L^+$, $V_L^-$, even if the injected current $I_b$ is switched off, the circuit remains in the memorized state at least until the thermal gradient is applied.

Unlike traditional superconducting memories driven by a magnetic field, the writing/erasing mechanism of the superconducting memory 1 of the present invention is performed through a direct injection of current into the superconducting memory 1. In particular, by injecting a positive or negative current $I_b$ (writing/erasing) directly into the parallel branch of the circuit, output states can be encoded as corresponding output voltages $V_L^+$ or $V_L^-$ across the resistive load 4, thus showing two discrete values (I/O state).

A thermal gradient (power supply) is applied to the thermoelectric element 2, and it determines the two output voltage levels (states) thanks to the bipolar thermoelectric effect, which correspond to two different logic states.

The thermal power supply can be provided to the superconducting memory 1 either by an external source or by exploiting the heat dissipated by other electrical elements in a superconducting logic circuit per se known (not shown in the figures), associated with the superconducting memory 1, during computing operations. Therefore, since this volatile memory works in synergy with a related logic circuit (quantum or classical), the superconducting memory 1 of the present invention, in principle, does not need to be supplied by an external source, but it could exploit the heat losses of other devices, thus reducing the number of the required control lines (which represent a severe constrain at certain cryogenic temperatures).

The maximum distance between the two output voltage states occurs for the minimum but finite thermal gradient, thus requiring a lower possible power supply, as detailed here below.

Figure 2:
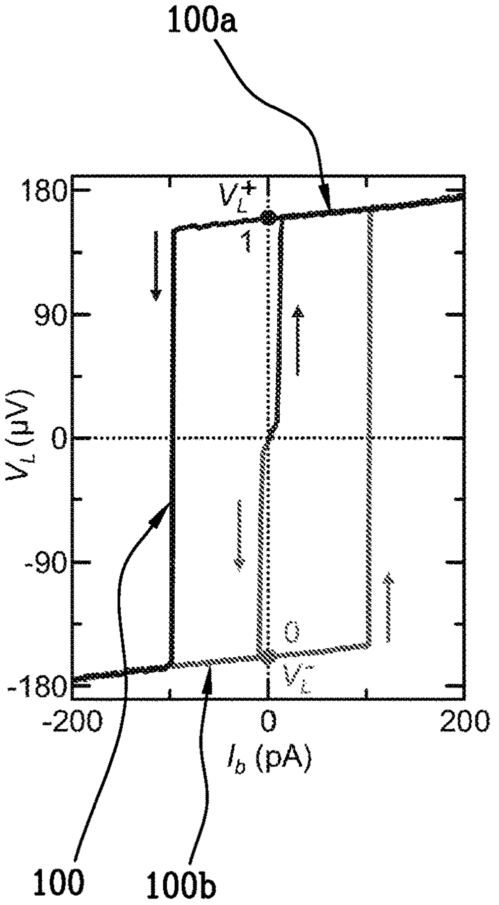
FIG. 2 shows a graph of the output voltage vs. the injected current in the superconducting memory.

FIG. 2 shows a graph of the output voltage $V_L$ vs. the injected current $I_b$ of the superconducting memory element 1.

This voltage-current characteristic or curve 100 presents a hysteretic behavior with non-zero output voltages ($V_L^+$/$V_L^-$) in a respective top 100*a* or bottom 100*b* part of the curve 100, even in the absence of injected current $I_b$ ($I_b$ equal to 0). The superconducting memory 1 is, therefore, able to store one of the two logical states (1 or 0), once the writing/erasing mechanism is activated.

The superconducting memory 1 is arranged to reach corresponding states based on the sign of the injected current $I_b$, which determines the sign of the generated voltage $V_L$+/$V_L^-$, as detailed hereinbelow.

Figure 3:
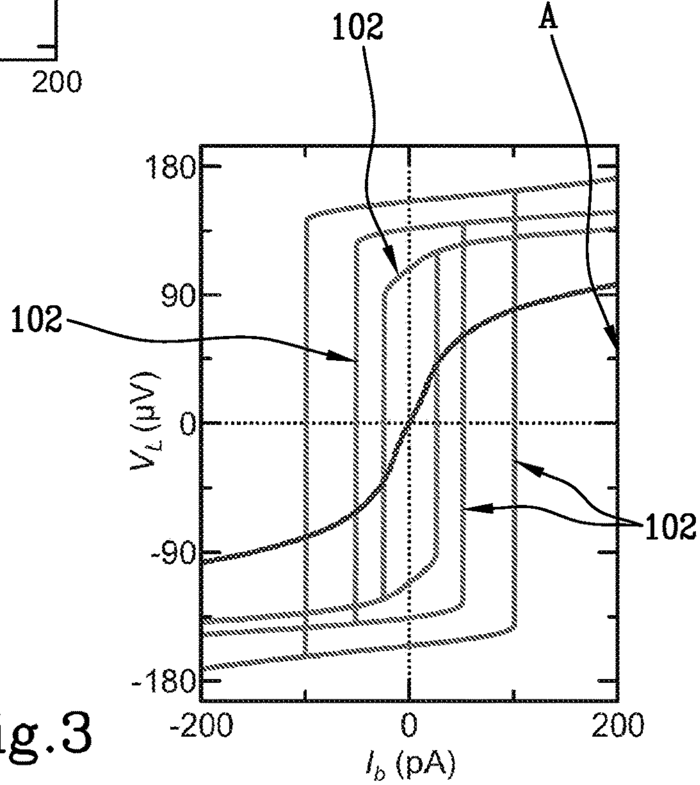
FIG. 3 shows multiple hysteretic curves of FIG. 2 obtained by applying raising thermal gradients.

FIG. 3 shows different curves 102 corresponding to the hysteretic curve 100 of FIG. 2 for the superconducting memory 1 obtained by applying different thermal gradients, which increase in the direction of the arrow A.

From FIG. 3, it is clear that the maximum distance between the two states (i.e., the maximum distance between the two generated output voltages $V_L^+$, $V_L^-$) occurs for low thermal powers. Therefore, the distance between the two possible states decreases by increasing the input power (thermal gradient). The two output voltages remain almost constant, instead, changing the resistive load 4, at least until the resistive load 4 reaches a minimum resistance that can be supported by the thermoelectric element 2.

The superconducting memory 1 is based on the thermoelectric element 2, which can be realized by exploiting different kinds of tunnel junctions per se known, based on superconductors and materials with an appropriate energy gap. Conveniently, the chosen materials present a predetermined level of particle-hole symmetry. Indeed, the bipolar thermoelectric effect, which develops in these junctions, is substantially determined by the spontaneous breaking of this symmetry in the nonlinear regime (finite thermal gradients).

The tunnel junctions are preferably realized with different superconducting materials ($Superconductor_1$-Insulator-$Superconductor_2$) with BCS (Bardeen-Cooper-Schrieffer) superconductors, multiband or non-conventional and/or even high-temperature superconductors, hybrid junctions with ferromagnet-insulator-superconductor (Superconductor-Insulator-Superconductor-Ferromagnetic), superconductor-semiconductor (Superconductor-Insulator-Semiconductor), Superconductor-Insulator-Carbon based junctions with nanotubes, nanoribbons or bilayers of graphene. Each combination of materials results in peculiar operating ranges (temperatures, voltage ranges, and thermodynamic efficiencies) and operating characteristics (the number of logic levels), which can be exploited to own advantage.

In particular, three different types of design for the junctions that can be used are here below disclosed.

The first type of junctions is that based on different superconducting materials ($Superconductor_1$-Insulator-$Superconductor_2$) obtained by embedding them (or not) in a superconducting quantum interference device (SQUID).

FIGS. 4*a*-4*c* show a top view of such junctions where the references 8 and 10 indicate a first and a second element made up of respectively a first superconducting material $Superconductor_1$ and a second superconducting material $Superconductor_2$. The two superconducting materials should be selected/designed properly to keep the ratio between the two energy gaps different from 1 and in the range 0.3-0.7 to get the best bipolar thermoelectrical performances.

In FIG. 4*a* the first element 8 is a layer having a C-section and it is coupled to the second element 10 which is a layer having a linear section.

In FIG. 4*b* the first element 8 is a layer having an E-section and it is coupled to the second element 10 which is a layer having a linear section.

In FIG. 4*c* the first element 8 comprises two portions having linear sections connected to the second element 10 which is a layer having a linear section.

Reference 12 indicates the contacts of the thermoelectric element 2 arranged to connect the thermal element 12 to the rest of the circuit of the superconducting memory 1 (see also FIG. 1). In all three designs, the thermal gradient has to be established between elements 8 and 10. In such junctions, the presence of the Josephson coupling is detrimental to the thermoelectric effect (electrically shortening the junction). For this reason, the critical current is reduced by using a magnetic flux through a SQUID with a single (FIG. 4*a*) or double ring (FIG. 4*b*) or by adopting a simplified design by using very opaque junctions (high resistance in the normal state) (FIG. 4*c*). FIG. 4*a* shows a SQUID with a single ring, where $\phi 1$ is the flux through the loop, FIG. 4*b* shows a SQUID with a double ring, where $\phi 1$ and $\phi 2$ are the magnetic fluxes through the loops and FIG. 4*c* shows strongly opaque tunnel junction. Another option to reduce the Josephson coupling is to use the so-called "Fraunhofer effect" in extended junctions with an in-plane fixed magnetic field, which creates destructive interference of the Josephson component.

The second type of junctions is the Ferromagnetic insulator-Superconductor hybrid junction (S-I-S-FM), which exploit the interaction between the ferromagnetic insulator and the adjacent superconductor [Phys. Rev. B 104, 184502 (2021)]. In this class of devices, the writing mechanism could also be done by charge or spin currents. In this case, the superconducting memory 1 can interact with devices using spin logic elements, inherent to spintronics.

FIG. 5 shows a sectional view of a Superconductor-Insulator-Superconductor-Ferromagnetic insulator junction (S-I-S-FM), where a first and a second superconductor layers 14 and 16 are separated by an insulator layer 18. In this design the two layers 14, 16 can have the same energy gap. The second superconductor layer 16 interacts with an adjacent ferromagnetic insulator layer 20, while the first superconductor layer 14 is the hot electrode. In this design the Josephson coupling, if present, can be suppressed using the same methods discussed in the previous designs.

The third type of junctions is the Superconductor-Insulator-Semiconductor junction (S-I-Semi), where the energy gap of the Semiconductor (the conductivity) can be even manipulated by an electric field applied to the structure (top/bottom gate).

FIG. 6 shows a sectional view of a Superconductor-Insulator-Semiconductor junction, where a semiconductor layer 22 is put in contact with a superconductor layer 24, which acts as the cold electrode of the device. The semiconductor layer 22 has an energy gap ($E_g$) comparable with the superconducting gap (Δs) of the superconductor layer 24.

In the present description, comparable indicates that the ratio 2Δs/Eg is in the range between 0.3-0.7 to guarantee the best bipolar thermoelectrical performance.

The presence of a metallic top gate 26 and a bottom gate 28 controls the semiconductor layer doping. If the semiconductor is implemented in the form of a graphene bilayer, the energy gap of the semiconductor bilayer is tunable by varying the electric voltage difference between the top gate 26 and the bottom gate 28. An oxide layer 30 is placed between the semiconductor layer 22 and the top and bottom gates 26, 28. An advantage is the possibility to exploit the semiconductor layer 22 as the hot electrode. A further option is to couple a superconductor with other carbon-based nanostructures such as nanotubes and/or nanoribbons, where the nanostructure design determines the gap of the material. In such a case, the carbon-based nanostructures or the graphene bilayer is used as semiconductor layer 22. It is possible to use its intrinsic superconducting properties (for magic-angle graphene bilayer), and it is possible to control by field-effect not only its conductivity (the number of available states used in charge transport) but also the gap and its chemical potential (the material doping). Finally, due to the low dimensionality of the material, it is less demanding to keep a finite thermal gradient in the material without affecting too much the nearby elements.

Josephson coupling typically does not affect the behavior of this kind of structures of FIG. 6. In addition, the operating temperature of the hot lead is not limited by a certain critical temperature, which, instead, restricts the possible implementations of the junctions of FIG. 4 and FIG. 5.

As predicted by recent theoretical studies and experimentally demonstrated, in a $\text{Superconductor}_1$-Insulator-$\text{Superconductor}_2$ junction, by heating the superconductor with a higher energy gap, a thermoelectric current is spontaneously generated by the thermoelectric element 2 in opposition to applied voltages, when the voltage value is smaller than a predetermined Seebeck voltage $V_S$ ($|V|<|V_S|$).

FIG. 7 shows a current-voltage ($I_{TE}V$) characteristic of the thermoelectric element 2 (when the thermoelectric element 2 is connected to a voltage generator) where the references $V_S^{+/-}$ indicate the Seebeck voltages.

FIG. 7 basically corresponds to FIG. 2 wherein the voltage generator replaces the current generator, and there is no resistive load 4 connected in parallel (different set-up).

A thermoelectric current $I_{TE}$ (curve 104) is spontaneously generated by the thermoelectric element 2 when $I_{TE}V<0$, being the element in the thermoactive regime.

In the set-up used for obtaining the thermoelectric curve 104 (a voltage generator applied to the thermoelectric element 2), in absence of any current control $I_b$ ($I_b$ equal to 0), if the resistive load 4 is put in parallel to the thermoelectric element 2, the generated thermoelectric current $I_{TE}$ flows in the resistive load 4 (the situation represented by a load line 106). The crossings between the load line 106 and the $I_{TE}$ curve 104 determine an upper point 108 ($V_L^-$, $I_{TE}(V_L^-)$) and a down point 110 ($V_L^+$, $I_{TE}(V_L^+)$), which correspond to the two logic metastable states of the superconducting thermoelectric memory 1. The upper point 108 corresponds to the 0 state and the down point 110 corresponds to the 1 state (respectively ($V_L^-$, $I_b$=0) and ($V_L^+$, $I_b$=0)). Notably, if the load resistance is smaller than a minimum value represented by the inverse of the absolute value of the slope of a dashed resistive nominal line 112, the thermoelectric element 2 is not able to provide enough power to sustain a current flowing in the resistive load 4, thus making impossible to establish the metastable states. That value constitutes the minimum possible load resistance of the resistive load 4 to get the bipolar thermoelectric memory cell.

The injected current $I_b$ is used to switch the parallel of the thermoelectric element 2 and resistive load 4, which constitutes the memory cell.

The resistive load 4 is realized through a metallic element, or a semiconducting element, whose resistance can be controlled by field-effect, or a metallic junction (Metal-Insulator-Metal). Advantageously, it is fabricated directly on the same substrate of the thermoelectric element 2. Its nominal value must be greater than the minimum resistance that can be supported by the junction (dashed line 112 in FIG. 7), corresponding to the absolute value of the ratio of the voltage and the current at a peak point 113 of the thermoelectric curve 104.

The whole superconducting memory 1 (the bipolar thermoelectric element 2 and the load resistor 4), is arranged to be set at an appropriate predetermined temperature, to ensure the superconductive state of the thermoelectric element 2. Lower temperatures can promote the memory thermal stability by limiting the noise on the output voltage due to thermal excitations. Appropriate electrical design of the junction capacitance could be also used to reduce the adverse effects of noise. On the other hand, the current generator 6 can be arranged to work at room temperature to facilitate its use without degrading the performance of the bipolar thermoelectric memory 1.

The operation of this memory is based on a predetermined thermal gradient applied across the junction of the thermoelectric element 2. It is necessary to keep the superconductors at a temperature lower than their critical temperature and to heat the material of the junction that has the largest energy gap.

The superconducting memory 1 can operate in two different regimes: a “saturation” regime and a “threshold value” regime.

In the “saturation” regime, continuous injection of the current $I_b$ determines the memory state. Once the output voltage $V_L^{+/-}$ has been reached, if the injected current $I_b$ is put to zero (memory state), the superconducting memory 1 remains locked in the last logic state. This writing process stores one of two logic states by selecting the sign of the injected current.

The “threshold value” regime can be obtained only when the residual Josephson component of the junction is large enough to determine a third metastable state also at V=0. In such a case, a small current is exploited to unbalance the junction, which spontaneously moves into one of two possible logic states. Small current pulses, smaller than the values shown in the hysteresis cycle 100, can trigger the voltage state from V=0 to one of the two metastable states. Starting from a zero-bias metastable configuration ($V_L$ and $I_b$ equal to 0), the superconducting memory 1 jumps into one of the two memory states with small pulses of current (positive/negative). In this configuration, the superconducting memory 1 can also act as a current threshold detector.

In general, in an initial state (($I_b$, $V_L$)=(0,0)), the superconducting memory 1 is "activated" by a continuous current to start the memory process, then, the superconducting memory 1 continues to be used in the "saturation" regime up to the switching off of the superconducting memory 1 (removal of the thermal gradient). Then, the process starts again in the next use of the superconducting memory 1. Electrically shortening the junction by imposing V=0 to the junction restores the particle-hole symmetry and constitutes a sort of "reset" of the memory to the V=0 metastable state (if present).

FIG. 8 shows a block diagram of the step of a method for writing a superconducting memory 1.

In a first step 200, a superconducting memory 1 as above disclosed is provided and a thermal gradient is applied to it (see "*Nonlinear Thermoelectricity with Electron-Hole Symmetric Systems*" di G. Marchegiani, A. Braggio and F. Giazotto, Physical Review Letters 124, 106801 (2020)). This creates the conditions to have a bipolar thermoelectric effect in the junction.

In a subsequent step 202, an injected current $I_b$ is sent to the thermoelectric element 2 and the resistive load 4, thus causing the generation of an output voltage $V_L$ on the resistive load 4 having a positive ($V_L^+$) or negative ($V_L^-$) value depending on the sign of the injected current $I_b$.

Injecting a bias current $I_b$ in the parallel means, figuratively, to sweep the thermoelectric curve 104 with the load line 106 with a slope equals to (−1/RL) and the value of intercept with the $I_{TE}$ axis equals to $I_b$ (in FIG. 7, dashed lines 114*a*, 114*b* correspond to the load line 106 in two different positions linked two different values of $I_b$). The voltage values of crossing points 116*a*, 116*b*, 116*c*, the upper point 108, the down point 110, and the peak point 113, obtained by crossing the thermoelectric curve 104 and the load lines 106, 114*a*, 114*b*, are the voltages $V_L(I_b)$, which are measured at the output of the superconducting memory 1. These values constitute the hysteresis of the superconducting memory 1. Indeed, connecting the crossing points 116*a*, 116*b*, 116*c*, the upper point 108, the down point 110 and the peak point 113, a hysteretic curve is obtained which corresponds to the hysteresis curve 100 of FIG. 2 (with almost a 90° rotation). In particular, for $I_b$=0 the load line 106 crosses the thermoelectric curve 104 in $V_L$+ and in $V_L^-$, which corresponds to the two logic states (I/O) of the superconducting memory 1.

The output voltage $V_L$ remains at its acquired positive or negative value on the top 100*a* or bottom 100*b* part of the curve 100 of FIG. 2.

After the writing mechanism, the memory remains triggered in the metastable state even when $I_b$=0. This is the typical state of the memory, where no current is required from the external generator but only the thermal gradient provides the power necessary to sustain the memory.

By increasing or reducing the injected current $I_b$, it passes, at step 204, on the opposite part of the curve 100 (i.e. the output voltage $V_L$ changes its sign), thus changing the state of the superconducting memory 1.

The superconducting memory 1 of the present invention exploits fabrication techniques and superconducting materials already widely tested in the industry (SQUID, RSFQ, etc.), therefore, it has direct application in classical and quantum computation, where the heat dissipated in circuit components can be recovered and reused to thermally supply the device, which generates the usable electrical power.

The superconducting memories used so far are driven in a magnetic field, showing limitations in response times [Phys. Proc. 36, 35-41 (2012)]. By exploiting an injection current, instead, the response time of the memory is determined exclusively by the resistances and capacitances of the superconducting junctions (RC circuits), improving its performance.

In addition, the coupling with a magnetic field in the existing superconducting memories requires devices of high inductance, which can be difficult to miniaturize. Instead, the superconducting memory 1 of the present invention can be strongly miniaturized due to the purely galvanic writing/erasing mechanism.

Moreover, the writing/erasing method of the present invention (current bias) guarantees the operation of the superconducting memory 1 itself, by selecting one of the two logic output states. No external current in the current generator is necessary to keep the memory state, at least until the thermal bias in the junction is preserved (by power supply or harvested heat). The superconducting memory 1 would not work if it were driven by a bias voltage, as a thermoelectric element is normally investigated [Phys. Rev. Lett. 124, 106801 (2020)]. Indeed, if the current generator was substituted by a voltage generator, resetting the voltage to zero would also result in the annulment of the thermoelectric effect and, therefore, completely reset the superconducting memory 1.

Clearly, the principle of the invention remaining the same, the embodiments and the details of production can be varied considerably from what has been described and illustrated purely by way of non-limiting example, without departing from the scope of protection of the present as defined in the attached claims.

The invention claimed is:

1. A superconducting bipolar thermoelectric memory comprising:

a connection in parallel between a bipolar thermoelectric element and a predetermined resistive load, and a current generator arranged to send an injected current to the thermoelectric element and the resistive load, wherein the thermoelectric element is arranged to be heated by a predetermined thermal gradient and to generate corresponding output voltages on the resistive load depending on a sign of the injected current the output voltages corresponding to respective logic states stored by the memory, and wherein a voltage current curve of the superconducting memory has a hysteretic shape with non-zero output voltages in a respective top or bottom part of the curve even in the absence of the injected current.

2. The superconducting memory according to claim 1, wherein a maximum distance between the output voltages decreases by increasing the thermal gradient.

3. The superconducting memory according to claim 1, wherein the thermoelectric element comprises a junction including a first element comprising a first superconducting material coupled to a second element comprising a second superconducting material, wherein two superconducting gaps of the first and second superconducting materials are not identical.

4. The superconducting memory according to claim 1, wherein the thermoelectric element comprises a junction including a first superconductor layer and a second superconductor layer separated by an insulator layer, the two layers and having a same energy gap, wherein the second superconductor layer interacts with an adjacent ferromagnetic insulator layer and the first superconductor layer is a hot electrode.

5. The superconducting memory according to claim 1, wherein the thermoelectric element and the resistive load are arranged to be placed at a predetermined cryogenic temperature to ensure a superconductive state of the thermoelectric element, and the current generator is arranged to be at room temperature.

6. A method for writing a superconducting bipolar thermoelectric memory comprising the steps of:

providing the superconducting memory according to claim 1 and applying a thermal gradient to the superconducting memory;

sending an injected current to the thermoelectric element and the resistive load, thus causing generation of the output voltage on the resistive load having a positive or negative value depending on the sign of the injected current.

7. The method according to claim 6, further comprising the steps of increasing or reducing the injected current so that the output voltage changes the sign of the injected current, thus changing the state of the superconducting memory.

8. A superconducting bipolar thermoelectric memory comprising:

a connection in parallel between a bipolar thermoelectric element and a predetermined resistive load, and a current generator arranged to send an injected current to the thermoelectric element and the resistive load, wherein the thermoelectric element is arranged to be heated by a predetermined thermal gradient and to generate corresponding output voltages on the resistive load depending on a sign of the injected current the output voltages corresponding to respective logic states stored by the memory, and wherein the thermoelectric element comprises a junction including a semiconductor layer put in contact with a superconductor layer which acts as a cold electrode of the superconducting memory, the semiconductor layer having an energy gap comparable with the one of the superconductor layer and the junction further including a metallic top gate and a bottom gate to control the energy gap of the junction and an oxide layer placed between the semiconductor layer and the top and bottom gates.

* * * * *